US012703826B2

(12) United States Patent
Roh et al.

(10) Patent No.: US 12,703,826 B2
(45) Date of Patent: Aug. 11, 2026

(54) ETCHANT COMPOSITION, A PATTERN FORMATION METHOD AND A MANUFACTURING METHOD OF ARRAY SUBSTRATE USING THE ETCHANT COMPOSITION

(71) Applicants: Dongwoo Fine-Chem Co., Ltd., Iksan-si (KR); Samsung Electronics CO., LTD., Suwon-si (KR)

(72) Inventors: Jin-Kyu Roh, Gangbuk-gu (KR); Ji-Won Kim, Iksan-si (KR); Kyu-Sang Ahn, Yeongdeungpo-gu (KR); Hee-Suk Woo, Hwaseong-si (KR); Jung-Min Oh, Hwaseong-si (KR); Sang-Won Bae, Hwaseong-si (KR); Hyo-San Lee, Hwaseong-si (KR)

(73) Assignees: Dongwoo Fine-Chem Co., Ltd., Iksan-si (KR); Samsung Electronics CO., LTD., Suwon-si (KR)

( * ) Notice: Subject to any disclaimer, the term of this patent is extended or adjusted under 35 U.S.C. 154(b) by 936 days.

(21) Appl. No.: 17/815,317

(22) Filed: Jul. 27, 2022

(65) Prior Publication Data

US 2024/0034932 A1 Feb. 1, 2024

(51) Int. Cl.
*C09K 13/00* (2006.01)
*H10P 50/64* (2026.01)
*H10P 50/66* (2026.01)

(52) U.S. Cl.
CPC ............ *C09K 13/00* (2013.01); *H10P 50/642* (2026.01); *H10P 50/667* (2026.01)

(58) Field of Classification Search
CPC ... C09K 13/00; C09K 13/02; H01L 21/30604; H01L 21/32134; H10P 50/642; H10P 50/667
USPC ................................................ 252/79.1–79.5
See application file for complete search history.

(56) References Cited

U.S. PATENT DOCUMENTS

| | | | | |
|---|---|---|---|---|
| 4,808,233 | A * | 2/1989 | Pfannkoch | B01J 20/3433 134/2 |
| 11,084,981 | B2 * | 8/2021 | Tsai | C09K 13/00 |
| 2016/0168485 | A1 * | 6/2016 | Li | B01J 20/3272 210/651 |
| 2017/0101607 | A1 * | 4/2017 | Aoyama | C11D 7/04 |
| 2022/0073819 | A1 * | 3/2022 | Roh | H01L 21/32134 |

FOREIGN PATENT DOCUMENTS

| | | | | |
|---|---|---|---|---|
| KR | 10-2014-0079267 | A | 6/2014 | |
| KR | 10-2021-0052202 | A | 5/2021 | |
| KR | 20230001681 | A * | 1/2023 | C09K 13/00 |

OTHER PUBLICATIONS

English translation of KR-2023-0001681-A (Year: 2023).*

* cited by examiner

*Primary Examiner* — Anita K Alanko
(74) *Attorney, Agent, or Firm* — TraskBritt

(57) ABSTRACT

An etchant composition contains (A) an alkaline compound, (B) an organoaluminum, and (C) water. The composition may be used in a method of forming a pattern. The composition also may be used in a method of fabricating an array substrate.

13 Claims, No Drawings

ETCHANT COMPOSITION, A PATTERN FORMATION METHOD AND A MANUFACTURING METHOD OF ARRAY SUBSTRATE USING THE ETCHANT COMPOSITION

TECHNICAL FIELD

The present disclosure relates to an etchant composition, a method of forming a pattern using the same, and a method of fabricating an array substrate using the same, and an array substrate fabricated by the method.

BACKGROUND

With the development of an information technology (IT) field, roles of semiconductor integrated circuits (ICs), semiconductor devices, semiconductor apparatuses, etc. have become increasingly important in modern society, and they have been widely used in electronic devices in various industrial fields. Recently, as the electronic devices have been made smaller, thinner, lighter, and higher in performance, semiconductor devices used therein have also been required to have excellent storage capacity and achieve high-speed storage operations. As these semiconductor devices have been highly integrated, it has become necessary to form fine patterns of several tens of nanometers (nm) or less.

Processes for fabricating semiconductor devices include a series of processes such as a deposition process, a photolithography process, an etching process, and an ion implantation process. Through these processes, desired devices are fabricated by forming various layers, such as an oxide layer, a nitride layer, a polysilicon layer, and a metal layer, on a wafer, and patterning these layers into desired shapes. In this case, in order to achieve high integration and micronization of semiconductor devices, an etch-target layer needs to be etched with high selectivity.

In semiconductor devices, polysilicon (which is polycrystalline silicon (poly-Si)) is used in various applications such as forming a gate electrode, a capacitor electrode, a plug, an etching mask, and the like. To this end, not only methods of forming a layer using polysilicon, but also methods of removing the formed polysilicon layer have been developed in various ways.

The methods of removing the polysilicon layer may be roughly divided into a dry etching process and a wet etching process.

The dry etching process is performed using an etching gas in a plasma state. Specifically, the dry etching process is an etching method that uses a chemical reaction between a reactive material such as ions or radicals contained in the etching gas and a material that is to be removed.

Meanwhile, the wet etching process is an etching method that uses a chemical etchant. The wet etching process is performed by immersing an object to be removed in the etchant. The wet etching process has advantages over the dry etching process in that the configuration of the system used is simple and the process time is shortened. Accordingly, the demand for etchants for use in the wet etching process has grown rapidly with the development of industries to which semiconductors are applied.

Korean Patent Application Publication No. 10-2014-0079267 relates to an acidic etchant composition and discloses a technique of etching a silicon nitride layer using phosphoric acid and a silicon compound, but does not disclose an etchant composition showing a high etch rate for polysilicon, and, in particular, may not exhibit a sufficient etching effect on fine pattern etching. In addition, the acidic etchant composition has a mechanism of oxidizing silicon to form a silicon oxide layer and then removing the silicon oxide layer with a fluoride such as hydrofluoric acid, and thus the acidic etchant composition is not suitable for a structure that uses a silicon oxide layer as a protective layer.

BRIEF SUMMARY

The present disclosure has been made in order to solve the above-described problems occurring in the prior art, and an object of the present disclosure is to provide an etchant composition, which has a high etch rate for a silicon layer while improving the etch resistance of a silicon oxide layer, in a process of forming a fine pattern having a size of 50 to 500 nm by etching.

However, objects to be achieved by the present disclosure are not limited to the above-described object, and other objects not mentioned herein will be clearly understood by those skilled in the art from the following description.

In order to achieve the above object, the present disclosure provides an etchant composition containing: (A) an alkaline compound, (B) an organoaluminum; and (C) water.

The present disclosure also provides a method for forming a pattern, the method including steps of: forming a silicon layer on a substrate; and etching the silicon layer using the etchant composition according to the present disclosure.

The present disclosure also provides a method for fabricating an array substrate including the method for forming a pattern, and an array substrate fabricated thereby.

According to the present disclosure, it is possible to provide an etchant composition, which has excellent etching properties for a silicon layer while allowing a silicon oxide layer to have excellent etching resistance properties, and thus improves the etch selectivity of the silicon layer with respect to the silicon oxide layer, in a process of forming a fine pattern having a size of 50 to 500 nm. In addition, it is possible to provide a method of forming a pattern using the etchant composition, and a method of fabricating an array substrate using the etchant composition.

DETAILED DESCRIPTION

The present disclosure provides an etchant composition containing (A) an alkaline compound, (B) an organoaluminum. and (C) water, a method of forming a pattern using the etchant composition, a method of fabricating an array substrate using the etchant composition, and an array substrate fabricated by the method.

The etchant composition according to the present disclosure, the method of forming a pattern using the etchant composition, and the method of fabricating an array substrate using the etchant composition may improve the etching resistance of a silicon oxide layer to prevent etching of silicon oxide while maintaining the high etch rate of a silicon layer, in a process of forming a fine pattern by etching. In the present disclosure, the fine pattern may be a pattern having a size of 50 to 500 nm.

The alkaline etchant composition according to the present disclosure may minimize damage to a silicon oxide layer, and thus provide an excellent effect on the etch selectivity of a silicon layer with respect to a silicon oxide layer. This is because, in a structure in which silicon is etched and a silicon oxide layer is used as a protective layer, a process in which bonds of silicon having lower bond energy (340 kJ/mol) than the silicon oxide layer (452 kJ/mol) are broken by the hydroxyl group (OH—) of the alkaline compound, that is, etching of the silicon, proceeds very fast.

The etchant composition according to the present disclosure, the method of forming a pattern using the same, and the method of fabricating an array substrate using the same may be used for etching of silicon, preferably, etching of polysilicon, and allow silicon oxide to have etching resistance properties, thereby selectively etching silicon. Specifically, in the present disclosure, the silicon to be etched has a polycrystalline structure and exhibits a high etch rate in acid/alkali environments. Thus, the silicon may be a polysilicon that is mainly used as a dummy structure in a process requiring a high etch rate, and may be a dummy silicon that is used in a process requiring a high etch rate, such as a structure having a deep trench.

In the present specification, the term “silicon” or “silicon layer” may refer to polysilicon or a polysilicon layer.

In addition, the etchant composition according to the present disclosure is an alkaline etchant composition for etching silicon. A silicon etching reaction does not occur at pH 9 or lower where hydroxide ions (OH—) are insufficient, and the silicon etching reaction may effectively occur at pH 12 or higher where hydroxide ions (OH—) are sufficient. When the pH of the etchant composition is 12 or higher, the etch rate for silicon increases, the relative etch rates for silicon oxide (SiOx) and silicon nitride (SiN) are low, and thus it is possible to ensure high selectivity for etching silicon. Accordingly, in selective etching of silicon included in a patterned structure including silicon, silicon oxide and silicon nitride, for example, a patterned structure in which silicon oxide and silicon nitride are sequentially deposited, the etch rate and selectivity for etching silicon are very important factors.

Etchant Composition

The etchant composition according to the present disclosure may contain: (A) an alkaline compound; (B) an organoaluminum; and (C) water as a solvent.

(A) Alkaline Compound

The alkaline compound contained in the etchant composition according to the present disclosure is added for the purpose of etching polysilicon, and may improve the etching rate of the etchant composition.

In addition, the alkaline compound used in the present disclosure is a component for increasing the pH of the composition, may be used to etch silicon and increase the stability of the organoaluminum additive, and may include an organic hydroxide, an inorganic hydroxide, or an amine-based compound. Preferably, the alkaline compound may include a hydroxide, which is in a form bonded with an inorganic or organic cation.

The organic hydroxide may be classified according to the structure, and examples thereof include a quaternary alkylammonium compound, an azabicyclo-type compound, a diazabicyclo-type compound, and a triazabicyclo-type compound. For example, the organic hydroxide may be at least one selected from a group consisting of azabicyclo (containing nitric acid in a carbon bicyclic structure)-, diazabicyclo-, and triazabicyclo-butane, -pentane, -hexane, -heptane, -octane, -nonane, -decane, -undecane, -dodecane, -tridecane, -tetradecane, -nonene, -decene, and -undecene.

The amine-based compound may be classified according to the structure, and may be at least one selected from a group consisting of 1,2-diaminopropane, 1-amino-2-propanol, 2-amino-1-butanol, 3-amino-1-propanol, 3-amino-1,2-propanediol, 2,3-budanediol, diethylenetriamine, isopropylamine, methyldiethanolamine, triethylamine, trimethylamine, methylamine, ethylamine, propanolamine, ethanolamine, aniline, 2-aminopentane, diethylamine, diethanolamine, N-methylethanolamine, N-methyldiethanolamine, 2-amino-3-methyl-1-butanol, 3-amino-2,2-dimethyl-1-propanol, tris(hydroxymethyl)aminomethane, 2-amino-2-methyl-1,3-propanediol, 3-methylamino-1-propanol, 2-dimethylamino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)2-propanol, diethanolamine N-propyldiethanolamine, N-isopropyldiethanolamine, N-(2-methylpropyl) di ethanolamine, N-n-butyldiethanolamine, N-t-butylethanolamine, N-cyclohexyldiethanolamine, N-dodecyldiethylamine, 2-(dimethylamino)ethanol, 2-diethylaminoethanol, 2-dipropylaminoethanol, 2-butylaminoethanol, 2-t-butylaminoethanol, 2-cycloaminoethanol, 2-amino-2-pentanol, 2-[bis(2-hydroxyethyl)amino]-2-methyl-1-propanol, 2-[bis(2-hydroxyethyl)amino]-2-propanol, N,N-bis(2-hydroxypropyl)ethanolamine, 2-amino-2-methyl-1-propanol, tris(hydroxymethyl)aminomethane, triisopropanolamine, trimethylpyridine, and dimethylpyridine.

Examples of the inorganic hydroxide include lithium hydroxide, sodium hydroxide, potassium hydroxide, rubidium hydroxide, cesium hydroxide, francium hydroxide, and the like.

In one embodiment of the present disclosure, the quaternary alkylammonium compound may be a quaternary alkylammonium hydroxide, which is a compound represented by the following Formula 2.

[Formula 2]

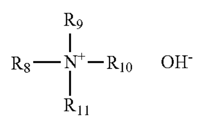

In Formula 2 above, $R_8$ to $R_{11}$ are each independently a hydrocarbon group having 1 to 8 carbon atoms, preferably an alkyl group having 1 to 8 carbon atoms, more preferably an alkyl group having 1 to 4 carbon atoms.

As one example, the compound represented by Formula 2 may be at least one selected from a group consisting of tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, and methyltributylammonium hydroxide. Preferably, it may be at least one selected from a group consisting of tetramethylammonium hydroxide, tetraethylammonium hydroxide, tetrapropylammonium hydroxide, tetrabutylammonium hydroxide, ammonium tetrahexyl hydroxide, and tetraoctylammonium hydroxide. More preferably, it may be at least one selected from a group consisting of tetramethylammonium hydroxide, tetraethylammonium hydroxide, tetrapropylammonium hydroxide, and tetrabutylammonium hydroxide.

When the content of the alkaline compound is 0.1 to 80 wt %, the pH of the etchant composition may be adjusted to 12 or higher depending on the content of the alkaline compound. For example, when the alkaline compound is tetramethylammonium hydroxide and the content thereof is 0.1 to 80 wt %, the pH of the etchant composition becomes 12 or higher. Specifically, the content of the alkaline compound is preferably 0.1 to 80 wt %, more preferably 0.1 to 50 wt %, based on the total weight of the composition. It is preferable that the content of the alkaline compound is controlled so that the pH of the alkaline compound becomes 12 or higher.

When the content of the alkaline compound is within the above-described content range and the pH of the etchant composition is within the above-described range, the absolute amount of hydroxide ions ($OH^-$) may be maintained at an appropriate level, resulting in an increase in the etch rate of polysilicon, and hydrolysis into aluminum hydroxide may proceed rapidly through the reaction between the organoaluminum additive and the $OH^-$, resulting in an increase in the solubility of the organoaluminum additive and thus an increase in the stability of the organoaluminum additive, thereby allowing a silicon oxide layer to have etch resistance to the etchant composition. On the other hand, if the content of the alkaline compound is less than 0.1 wt %, the solubility of the aluminum hydroxide may decrease, resulting in agglomeration and precipitation phenomena, and the etch resistance of a silicon oxide layer may be lowered. If the content of the alkaline compound is more than 80 wt %, silicon may have etching resistance due to the alkaline compound, and thus the etching performance of the etchant composition for polysilicon may be degraded.

(B) Organoaluminum

The organoaluminum contained in the etchant composition according to the present disclosure is an additive for improving the etch resistance of silicon oxide, and includes a compound represented by the following Formula 1.

[Formula 1]

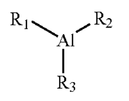

In Formula 1 above, $R_1$ to $R_3$ are each independently an alkyl group having 1 to 5 carbon atoms, an alkoxy group having 1 to 5 carbon atoms, or an aryl group having 6 to 30 carbon atoms, wherein the alkyl group having 1 to 5 carbon atoms may be unsubstituted or substituted with one or more of an amine group, an aniline group, a quinol group, hydrogen, silicon, and halogens.

The organoaluminum exists in the form of an $Al^{3+}$ cation under acidic conditions, and as the pH increases, a nucleophilic reaction (Sn2) between $Al^{3+}$ and hydroxide ions ($OH^-$) occurs to form aluminum hydroxide. In particular, at pH 12 or higher, the aluminum hydroxide may exist in the form of ions such as $Al(OH)_4^-$ or $Al(OH)_5^{2-}$, and thus have high solubility and stability in a solution phase, and may form an aluminosilicate structure on the surface of a silicon oxide layer, thereby allowing the silicon oxide layer to have etch resistance. Due to the etch resistance of the silicon oxide layer, it is possible to remove a silicon layer to a predetermined thickness and increase the etch selectivity of the silicon layer with respect to the silicon oxide layer. Thus, it is possible to increase the reliability of the etching process, thereby providing a semiconductor device with high quality and productivity.

As an example, the organoaluminum may be at least one selected from the group consisting of tris(8-hydroxyquinoline)aluminum, aluminum octadecenoate, aluminum acetate, diisobutylaluminum hydride, trimethylaluminum, triethylaluminum, aluminum normal-butoxide, aluminum tri-sec-butoxide, tris(normal-nitroso-normal-phenylhydroxylaminato)aluminum, aluminum triformate, aluminum isopropoxide, aluminum acetylacetonate, aluminum glycinate, diethylaluminum chloride, aluminum trifluoromethanesulfonate, aluminum tert-butoxide, triisobutyl aluminum, aluminum acrylate, aluminum hexafluoro-2,4-pentanedionate, tripropyl aluminum, aluminum phenoxide, ethylaluminum sesquichloride, aluminum di(isopropoxide)acetoacetic ester chelate, bis(ethylacetoacetato)(2,4-pentanedionato) aluminum, diisobutylaluminum chloride, ethylaluminum dichloride, bis(8-hydroxy-2-methylquinoline)-(4-phenylphenoxy)aluminum, aluminum 9-octadecenylaceto-diisopropoxide, aluminum 2-ethylhexanoate, diisobutyl aluminum fluoride, aluminum methoxide, aluminum ethoxide, dimethylaluminum isopropoxide, aluminum phthalocyanine, diethylaluminum iodide, tri-normal-butylaluminum, tris(2,2,6,6-tetramethyl-3,5-heptanedionato)aluminum, tri-normal-hexylaluminum, tri-normal-octylaluminum, poly (oxoaluminum 2-ethylhexanoate), diethylaluminum ethoxide, aluminium phthalocyanine chloride, methylaluminoxane, aluminum di(sec-butoxide)acetoacetic ester chelate, aluminum magnesium isopropoxide, dimethylaluminum chloride, aluminum tartrate, aluminum maltolate, aluminum citrate, aluminum L-lactate, aluminum myristate, aluminum benzoate, and dihydroxyaluminum octanate.

Preferably, the organoaluminum may be at least one elected from the group consisting of trimethylaluminum, triethylaluminum, aluminum normal-butoxide, aluminum tri-sec-butoxide, diethylaluminum chloride, triisobutylaluminum, aluminum 2-ethylhexanoate, isobutylaluminum fluoride, aluminum methoxide, aluminum ethoxide, dimethylaluminum isopropoxide, methylaluminoxane, and dimethylaluminum chloride.

More preferably, the organoaluminum may be at least one selected from the group consisting of trimethylaluminum, aluminum tri-sec-butoxide, diethylaluminum chloride, aluminum ethoxide, and methylaluminoxane.

The content of the organoaluminum is preferably 0.001 to 20 wt %, more preferably, 0.01 to 10 wt %, based on the total weight of the composition. When the content of the organoaluminum is within the above content range, the organoaluminum may be converted into aluminum hydroxide by hydrolysis at a pH of 12 or higher, and the aluminum hydroxide may form an aluminosilicate structure on the surface of a silicon oxide layer, thereby allowing the silicon oxide layer to have etching resistance. On the other hand, if the content of the organoaluminum is less than 0.001 wt % based on the total weight of the composition, the effect of allowing the silicon oxide layer to have etching resistance may be insignificant, and thus the silicon layer may not have etch selectivity with respect to the silicon oxide layer. If the content of the organoaluminum is more than 20 wt % based on the total weight of the composition, it may be difficult to form a sufficient amount of aluminum hydroxide due to poor solubility of the organoaluminum, and the organoaluminum may function as an etching inhibitor for the silicon layer.

(C) Water

Water contained in the etchant composition according to the present disclosure may be deionized water for the semiconductor process, and is preferably deionized water having a resistivity of 18 MΩ/cm or more.

In the present disclosure, the water may be contained in a balance amount. The term "balance amount" refers to an amount that allows the total weight of the composition containing the essential components and further containing other components according to the present disclosure to become 100 wt %.

Specifically, in the present disclosure, water may be contained in an amount of 75 to 95 wt % based on the total weight of the composition.

<Method for Forming Pattern>

The present disclosure also provides a method for forming a pattern using the etchant composition according to the present disclosure. The method of forming a pattern according to the present disclosure may form a pattern according to a known pattern forming method, except that the etchant composition according to the present disclosure is used.

For example, the method of forming a pattern includes steps of: forming a silicon layer on a substrate; and etching the silicon layer using the etchant composition according to the present disclosure. Here, the silicon layer includes a polysilicon layer.

In addition, the method of forming a pattern may further include a step of forming a silicon oxide layer. In this case, the silicon layer is selectively etched using the etchant composition in the step of etching the silicon layer.

<Method for Fabricating Array Substrate>

The present disclosure also provides a method of fabricating an array substrate using the etchant composition according to the present disclosure. The method of fabricating an array substrate according to the present disclosure may fabricate an array substrate according to a known method for fabricating an array substrate, except that the etchant composition according to the present disclosure is used.

For example, the method for fabricating an array substrate includes the above-described method of forming a pattern. Specifically, the method for fabricating an array substrate may include steps of: a) forming a gate electrode on a substrate; b) forming a gate insulating layer on the substrate including the gate electrode; c) forming a semiconductor layer (a-Si:H) on the gate insulating layer; d) forming source/drain electrodes on the semiconductor layer; and e) forming a pixel electrode connected to the drain electrode, wherein step a), b) or c) may include etching using the etchant composition according to the present disclosure.

<Array Substrate Fabricated by the Method of Fabricating Array Substrate>

The present disclosure may also include an array substrate fabricated according to the above-described method of fabricating an array substrate, and any device including the array substrate.

For example, the array substrate may be a thin film transistor (TFT) array substrate.

Hereinafter, the present disclosure will be described in more detail with reference to examples. However, the following examples are provided to describe the present disclosure in more detail, and the scope of the present disclosure is not limited by the following examples.

Preparation of Etchant Compositions According to Examples and Comparative Examples Etchant compositions of Examples and Comparative Examples were prepared by mixing the components shown in Tables 1 and 2 below in the amounts (wt %) shown in Tables 1 and 2 and adding the balance of water to each mixture. The content of the alkaline compound was set based on the pH of the final etchant composition.

TABLE 1

| Composition (wt %) | Composition pH | A-1 | A-2 | A-3 | A-4 | A-5 | B-1 | B-2 | B-3 | B-4 | B-5 | Water |
|---|---|---|---|---|---|---|---|---|---|---|---|---|
| Example 1 | 14 | 10 | | | | | 0.1 | | | | | Balance |
| Example 2 | 14 | | 5 | | | | 0.1 | | | | | Balance |
| Example 3 | 13 | | | 1 | | | 0.1 | | | | | Balance |
| Example 4 | 12.5 | | | | 50 | | 0.1 | | | | | Balance |
| Example 5 | 12 | | | | | 80 | 0.1 | | | | | Balance |
| Example 6 | 14 | 10 | | | | | | 0.01 | | | | Balance |
| Example 7 | 14 | 10 | | | | | | | 1 | | | Balance |
| Example 8 | 14 | 10 | | | | | | | | 5 | | Balance |
| Example 9 | 14 | 10 | | | | | | | | | 10 | Balance |
| Example 10 | 13 | 1 | | | | | 0.1 | | | | | Balance |
| Example 11 | 12 | 0.1 | | | | | 0.1 | | | | | Balance |
| Example 12 | 11 | 0.01 | | | | | 0.1 | | | | | Balance |
| Example 13 | 14 | | 85 | | | | 0.1 | | | | | Balance |
| Example 14 | 14 | 10 | | | | | 0.0001 | | | | | Balance |
| Example 15 | 14 | 10 | | | | | 0.001 | | | | | Balance |
| Example 16 | 14 | 10 | | | | | 1 | | | | | Balance |
| Example 17 | 14 | 10 | | | | | 5 | | | | | Balance |
| Example 18 | 14 | 10 | | | | | 10 | | | | | Balance |
| Example 19 | 14 | 10 | | | | | 20 | | | | | Balance |
| Example 20 | 14 | 10 | | | | | 25 | | | | | Balance |

TABLE 2

| Composition (wt %) | Composite pH | A-1 | C-1 | C-2 | C-3 | B-1 | D-1 | D-2 | D-3 | Water |
|---|---|---|---|---|---|---|---|---|---|---|
| Comparative Example 1 | 14 | 10 | | | | | | | | Balance |
| Comparative Example 2 | 11 | 0.01 | | | | | | | | Balance |
| Comparative Example 3 | 8 | | 10 | | | 0.1 | | | | Balance |

TABLE 2-continued

| Composition (wt %) | Composite pH | A-1 | C-1 | C-2 | C-3 | B-1 | D-1 | D-2 | D-3 | Water |
|---|---|---|---|---|---|---|---|---|---|---|
| Comparative Example 4 | 9 | | | 10 | | 0.1 | | | | Balance |
| Comparative Example 5 | 6 | | | | 10 | 0.1 | | | | Balance |
| Comparative Example 6 | 14 | 10 | | | | | 0.1 | | | Balance |
| Comparative Example 7 | 14 | 10 | | | | | | 0.1 | | Balance |
| Comparative Example 8 | 14 | 10 | | | | | | | 0.1 | Balance |

A-1: Tetramethylammonium hydroxide
A-2: 1,8-diazabicyclo[5.4.0]undec-7-ene
A-3: Potassium hydroxide
A-4: 1,2-diaminopropane
A-5: 1-amino-2-propanol
B-1: Aluminum ethoxide
B-2: Aluminum tri-sec-butoxide
B-3: Trimethylaluminum
B-4: Diethylaluminum chloride
B-5: Methylaluminoxane
C-1: Potassium sulfate
C-2: Tetramethylammonium chloride
C-3: Ethylene glycol
D-1: Tetraethylorthocarbonate
D-2: Tetramethylsilane
D-3: Triethyl phosphate

Experimental Example

For the etchant compositions according to the Examples and Comparative Examples, performance evaluations were performed as follows.

Evaluation 1: Evaluation of Etch Rate for Silicon

Samples were prepared by cutting a silicon wafer, on which silicon has been deposited to a thickness of 6,000 Å, to a size of 1.5×1.5 cm. The samples were immersed in each of the etchant compositions of the Examples and the Comparative Examples for 30 seconds under the conditions of 70° C. and 400 rpm. Then, the samples were taken out, washed with water, and dried in air. Next, the thickness of the silicon layer in each sample was measured using an ellipsometer, and then the etch rate of the silicon layer was calculated based on a change in the silicon layer thickness of each sample. In this case, the etch rate was evaluated based on the following criteria, and the results are shown in Table 3 below.

<Evaluation Criteria>

◎: Etch rate of 2,500 Å/min or more
○: Etch rate between less than 2,500 Å/min and 2,000 Å/min or more
Δ: Etch rate between less than 2,000 Å/min and 1,500 Å/min or more
X: Etch rate of less than 1,500 Å/min

Evaluation 2: Etching Rate Evaluation for Silicon Oxide Film

Samples were prepared by cutting a silicon oxide film to a size of 1.5×1.5 cm. The samples were immersed in each of the etchant compositions of the Examples and the Comparative Examples for 10 minutes under the conditions of at 70° C. and 400 rpm. Then, the samples were taken out, washed with water, dried in air. Next, the thickness of the silicon oxide film was measured using an ellipsometer, and the etch rate was calculated based on the change in thickness before and after etching. In this case, the etch rate was evaluated based on the following criteria, and the results are shown in Table 3 below.

<Evaluation Criteria>

◎: Etch rate of 0.2 Å/min or less
○: Etch rate between 0.4 Å/min or less and more than 0.2 Å/min
Δ: Etch rate between 0.6 Å/min or less and more than 0.4 Å/min
X: Etch rate of more than 0.6 Å/min

Evaluation 3: Stability of Composition

The stability of the composition of the present disclosure was evaluated. Mixing stability decreases depending on the proportion of the additives, and thus if recrystallization/precipitation occurs, it may function as an impurity upon etching of a silicon layer. To confirm this fact, the transparency of the composition was analyzed by UV-Vis spectroscopy, and the solubility of silicon in the composition was calculated. In this case, the solubility was evaluated based on the following criteria, and the results are shown in Table 3 below.

<Evaluation Criteria>

◎: 100%
○: between less than 100% and 98% or more
Δ: between less than 98% and 95% or more
X: less than 95%

TABLE 3

| | Etch rate of silicon | Etch rate of silicon oxide film | Stability of composition |
|---|---|---|---|
| Example 1 | ◎ | ◎ | ◎ |
| Example 2 | ◎ | ◎ | ◎ |
| Example 3 | ◎ | ◎ | ◎ |
| Example 4 | ○ | ◎ | ◎ |
| Example 5 | ○ | ◎ | ◎ |
| Example 6 | ◎ | ◎ | ◎ |
| Example 7 | ◎ | ◎ | ◎ |
| Example 8 | ◎ | ◎ | ◎ |
| Example 9 | ◎ | ◎ | ◎ |
| Example 10 | ◎ | ◎ | ◎ |
| Example 11 | ◎ | ◎ | ◎ |
| Example 12 | Δ | ◎ | Δ |
| Example 13 | Δ | ◎ | ◎ |
| Example 14 | ◎ | Δ | ◎ |
| Example 15 | ◎ | ○ | ◎ |
| Example 16 | ◎ | ◎ | ◎ |

TABLE 3-continued

| | Etch rate of silicon | Etch rate of silicon oxide film | Stability of composition |
|---|---|---|---|
| Example 17 | ◎ | ◎ | ◎ |
| Example 18 | ◎ | ◎ | ◎ |
| Example 19 | ○ | ◎ | ◎ |
| Example 20 | Δ | ◎ | ◎ |
| Comparative Example 1 | ◎ | X | ◎ |
| Comparative Example 2 | X | ◎ | ◎ |
| Comparative Example 3 | X | ◎ | X |
| Comparative Example 4 | X | ◎ | X |
| Comparative Example 5 | X | ◎ | X |
| Comparative Example 6 | ◎ | X | ◎ |
| Comparative Example 7 | ◎ | X | ◎ |
| Comparative Example 8 | ◎ | X | ◎ |

Using the compositions containing the alkaline compound and the additive (organoaluminum), the etching characteristics for silicon and the etching resistance of the silicon oxide film were evaluated. Through this Experimental Example, it could be confirmed that the organoaluminum represented by Formula 1 according to the present disclosure allowed the silicon oxide film to have etching resistance.

In addition, it could be confirmed that, in the case of the etchant compositions of Examples 1 to 20 containing proper amounts of the alkaline compound and the organoaluminum and having a pH of 12 or higher, the etch rate for silicon was high, the etching resistance of the silicon oxide film increased so that silicon could have etch selectivity with respect to the silicon oxide film, and the stability of the organoaluminum was high. On the other hand, it could be confirmed that, in the case of the etchant compositions of Comparative Examples 1 to 5 having compositions different from those of the present disclosure or having a pH of less than 12, the etch rate for silicon decreased, the etching resistance for the silicon oxide film decreased, and the stability of the organoaluminum was low.

In addition, it could be confirmed that, in Comparative Examples 6 to 8 in which the carbonate-based compound, the silane-based compound or the phosphate-based compound was used instead of the organoaluminum, the etching resistance of the silicon oxide film more significantly decreased, suggesting that the silicon layer did not have etch selectivity with respect to the silicon oxide film.

What is claimed is:

1. An etchant composition containing: (A) an alkaline compound; (B) an organoaluminum; and (C) water, wherein the organoaluminum (B) comprises a compound represented by the following Formula 1:

[Formula 1]

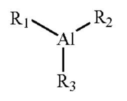

wherein $R_1$ to $R_3$ are each independently an alkyl group having 1 to 5 carbon atoms or an aryl group having 6 to 30 carbon atoms, wherein the alkyl group having 1 to 5 carbon atoms is unsubstituted or substituted with one or more of an amine group, an aniline group, a quinol group, hydrogen, silicon, and halogens.

2. The etchant composition of claim 1, wherein the organoaluminum (B) is methylaluminoxane.

3. The etchant composition of claim 1, containing, based on 100 wt % of the total weight of the etchant composition:

0.1 to 80 wt % of the alkaline compound (A);

0.001 to 20 wt % of the organoaluminum (B); and a balance of water (C).

4. The etchant composition of claim 1, wherein the etchant composition has a pH of 12 or higher.

5. The etchant composition of claim 1, wherein the alkaline compound (A) comprises a hydroxide in a form bonded with an inorganic or organic cation.

6. The etchant composition of claim 1, wherein the alkaline compound is a compound represented by following Formula 2:

[Formula 2]

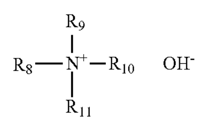

wherein $R_8$ to $R_{11}$ are each independently a hydrocarbon group having 1 to 8 carbon atoms.

7. The etchant composition of claim 6, wherein the compound represented by Formula 2 is at least one from the group consisting of tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, and methyltributylammonium hydroxide.

8. A method for forming a pattern, the method comprising steps of:

forming a silicon layer on a substrate; and etching the silicon layer using the etchant composition of claim 1.

9. The method of claim 8, further comprising a step of forming a silicon oxide layer, wherein the silicon layer is selectively etched using the etchant composition in the step of etching the silicon layer.

10. The method of claim 8, further comprising etching silicon with the etchant composition without etching silicon oxide.

11. The method of claim 8, further comprising forming a silicon pattern by selectively etching silicon with the etchant composition.

12. A method for fabricating an array substrate, the method comprising the method for forming a pattern according to claim 10.

13. An etchant composition containing: (A) an alkaline compound; (B) methylaluminoxane; and (C) water.

* * * * *